United States Patent
Kim et al.

(10) Patent No.: US 7,243,286 B2
(45) Date of Patent: Jul. 10, 2007

(54) METHOD AND APPARATUS FOR GENERATING PARITY INFORMATION FOR ERROR CORRECTION

(75) Inventors: Ki-hyun Kim, Seongnam-si (KR); Sung-hyu Han, Seoul (KR); In-sik Park, Suwon-si (KR); Jae-seong Shim, Seoul (KR); Yoon-woo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 567 days.

(21) Appl. No.: 10/738,203

(22) Filed: Dec. 18, 2003

(65) Prior Publication Data

US 2004/0199860 A1  Oct. 7, 2004

(30) Foreign Application Priority Data

Dec. 21, 2002 (KR) ................ 10-2002-0082091

(51) Int. Cl.
*H03M 13/13* (2006.01)
(52) U.S. Cl. .................................... 714/752
(58) Field of Classification Search ........... 714/752, 714/755
See application file for complete search history.

(56) References Cited

U.S. PATENT DOCUMENTS 6,785,863 B2 *  8/2004  Blankenship et al. ....... 714/799
6,895,547 B2 *  5/2005  Eleftheriou et al. ........ 714/801
2002/0101915 A1 *  8/2002  Zhang et al. ............... 375/222
2004/0054960 A1 *  3/2004  Eroz et al. .................. 714/800
2004/0057575 A1 *  3/2004  Zhang et al. .......... 379/399.02
2004/0255222 A1 * 12/2004  Kim et al. .................. 714/752

OTHER PUBLICATIONS

David J.C. MacKay; Good Error-Correcting Codes Based on Very Sparse Matrices; IEEE Transactions on Information Theory; vol. 45; No. 2; Mar. 1999; pp. 399-419.
Thomas J. Richardson & Rüdiger L. Urbanke; Efficient Encoding of Low-Density Parity-Check Codes; IEEE Transactions on Information Theory; Vo. 47; No. 2; Feb. 2001; pp. 638-656.

* cited by examiner

*Primary Examiner*—Stephen M. Baker
(74) *Attorney, Agent, or Firm*—Stein, McEwen & Bui, LLP

(57) ABSTRACT

A method of generating error correction parity information using a parity check matrix having m rows and n columns, wherein m is a number of parity bits and n is a number of codeword bits, wherein a same fixed number of elements in each of the rows has a value of 1 and all remaining elements in each of the rows has a value of 0, and wherein a same fixed number of elements in each of the columns has a value of 1 and all remaining elements in each of the columns has a value of 0, the error correction method including generating a lower triangular matrix in 1st through k-th rows and (n−m+1)-th through (n−m+k)-th columns of the parity check matrix by performing row and column permutations on the parity check matrix, wherein k<m; and obtaining m parity bits using the parity check matrix including the lower triangular matrix and (n−m) message bits.

22 Claims, 1 Drawing Sheet

METHOD AND APPARATUS FOR GENERATING PARITY INFORMATION FOR ERROR CORRECTION

CROSS-REFERENCE TO RELATED APPLICATIONS

This application claims the benefit of Korean Patent Application No. 2002-82091 filed on Dec. 21, 2002, in the Korean Intellectual Property Office, the disclosure of which is incorporated herein by reference in its entirety.

BACKGROUND OF THE INVENTION

1. Field of the Invention

An aspect of the invention relates to error correction and signal detection, and more particularly, to a method and apparatus for generating error correction parity information.

2. Description of the Related Art

A coding method using Low Density Parity Check (LDPC) codes for error correction creates a parity check code including predetermined numbers of "ones" in the rows and columns of an error correction code (ECC) block, and generates parity information using the parity check code.

More specifically, a parity check matrix H is created that includes a predetermined number of "ones" in the matrix columns and rows, and a codeword x satisfying the equation "Hx=0" is obtained. Here, the codeword x relates original data to parity information. For performing this calculation, the parity check matrix H is first transformed into a generator matrix G using Gaussian elimination, or transformed into a lower triangular form.

However, the generator matrix G requires large calculations due to the absence of sparseness of the original matrix. Also, the lower triangular form requires a complicated calculation process.

A conventional parity check matrix H is shown in FIG. 1. The following Equation (1) represents a lower triangular form of the calculation process for generating a codeword x satisfying "Hx=0". As apparent from Equation (1), the calculation process is complicated.

$$H\begin{bmatrix} A & B & T \\ C & D & E \end{bmatrix} \to H \times \begin{bmatrix} 1 & 0 \\ -ET^{-1} & 1 \end{bmatrix} = \begin{bmatrix} A & B & T \\ -ET^{-1}A+C & -ET^{-1}B+D & 0 \end{bmatrix} \quad (1)$$

$P_1 = -\Phi^{-1}[-ET^{-1}AS^T + CS^T]$, $\phi = -ET^{-1}B + D$, $P_2 = -T^{-1}[AS^T + BP_1^T]$ A basic concept for LDPC coding is disclosed in "Good Error-Correcting Codes Based on Very Sparse Matrices," by D. J. C. MacKay, IEEE Transactions on Information Theory, Vol. 45, No. 2, pp. 399-431, March 1999, and a technique for coupling the parity check matrix H is disclosed in "Efficient Encoding of Low-Density Parity-Check Codes," T. Richardson and R. Urbanke, IEEE Transactions on Information Theory, Vol. 47, No. 2, pp. 638-656, February 2001.

SUMMARY OF THE INVENTION

An aspect of the invention provides a method and apparatus for generating error correction parity information.

Another aspect of the invention also provides a method and apparatus for efficiently generating error correction parity information in a Low Density Parity Check (LDPC) coding.

According to an aspect of the invention, there is provided a method of generating error correction parity information using a parity check matrix having m rows and n columns, wherein m is a number of parity bits and n is a number of codeword bits, wherein a same fixed number of elements in each of the rows has a value of 1 and all remaining elements in each of the rows has a value of 0, and wherein a same fixed number of elements in each of the columns has a value of 1 and all remaining elements in each of the columns has a value of 0, the error correction method including generating a lower triangular matrix in 1st through k-th rows and (n−m+1)-th through (n−m+k)-th columns of the parity check matrix by performing row and column permutations on the parity check matrix, wherein k<m; and obtaining m parity bits using the parity check matrix including the lower triangular matrix and (n−m) message bits.

According to another aspect of the invention, the obtaining of the m parity bits includes obtaining k parity bits of the m parity bits using a backward substitution method according to the following equation applied to 1st through k-th rows and 1st through (n−m+k)-th columns of the parity check matrix:

$$P_l = -\sum_{j=1}^{n-m} H_{l,j} S_j - \sum_{j=1}^{l-1} H_{l,j+n-m} p_j$$

According to another aspect of the invention, there is provided a method of generating parity information including generating a parity check matrix, generating a lower triangular matrix based on the parity check matrix, generating a second matrix based on the parity check matrix, performing a backward substitution calculation based on message bits and the lower triangular matrix to obtain a first set of parity bits, and obtaining a second set of parity bits based on the second matrix, wherein when a number of parity bits in the second set of parity bits is added to a number of parity bits in the first set of parity bits, a result is obtained that equals a predetermined number of parity bits.

According to another aspect of the invention, a method of generating error correction parity information, the method including generating a parity check matrix having m rows and n columns, wherein m is a number of parity bits and n is a number of codeword bits, wherein a same fixed number of elements in each of the rows has a value of 1 and all remaining elements in each of the rows has a value of 0, and wherein a same fixed number of elements in each of the columns has a value of 1 and all remaining elements in each of the columns has a value of 0; generating a lower triangular matrix in 1st through k-th rows and (n−m+1)-th through (n−m+k)-th columns of the parity check matrix, wherein k<m; generating a second matrix in (k+1)-th through m-th rows and (n−m+k+1)-th through n-th columns of the parity check matrix, wherein all elements in an upper right corner portion of the second matrix have a value of 0; obtaining k parity bits of m parity bits by performing a backward substitution calculation using the lower triangular matrix and (n−m) message bits; and obtaining (m−k) parity bits of the m parity bits using the second matrix.

According to another aspect of the invention, there is provided an apparatus that generates error correction parity information, the error correction apparatus including a parity check matrix generator that generates a parity check matrix having m rows and n columns, wherein m is a number of parity bits and n is a number of codeword bits, wherein a same fixed number of elements in each of the rows has a value of 1 and all remaining elements in each of the rows has a value of 0, and wherein a same fixed number of elements in each of the columns has a value of 1 and all remaining elements in each of the columns has a value of 0; a first matrix generator that generates a lower triangular matrix in 1st through k-th rows and (n−m+1)-th through (n−m+k)-th columns of the parity check matrix, wherein k<m; a second matrix generator that generates a second matrix in (k+1)-th through m-th rows and (n−m+k+1)-th through n-th columns of the parity check matrix, wherein all elements in an upper right corner portion of the second matrix have a value of 0; a backward substitution calculator that obtains k parity bits of m parity bits by performing a backward substitution calculation using the lower triangular matrix and (n−m) message bits; and a lower parity calculator that obtains (m−k) parity bits of the m parity bits using the second matrix.

Additional aspects and/or advantages of the invention will be set forth in part in the description which follows and, in part, will be obvious from the description, or may be learned by practice of the invention.

BRIEF DESCRIPTION OF THE DRAWINGS

The above and/or other aspects and/or advantages of the invention will become apparent and more readily appreciated from the following description of embodiments of the invention, taken in conjunction with the accompanying drawings of which.

DETAILED DESCRIPTION OF THE EMBODIMENTS

Figure 1:
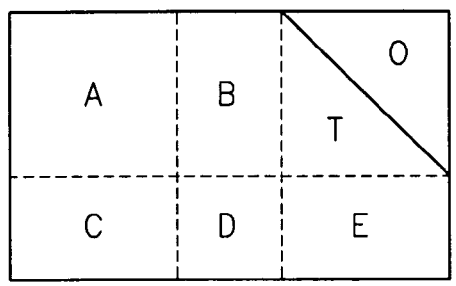
FIG. 1 shows a parity check matrix H for generating error correction parity information according to a conventional technique.

Reference will now be made in detail to embodiments of the invention, examples of which are shown in the accompanying drawings, wherein like reference numerals refer to like elements throughout. The embodiments are described below in order to explain the invention by referring to the figures.

Figure 2:
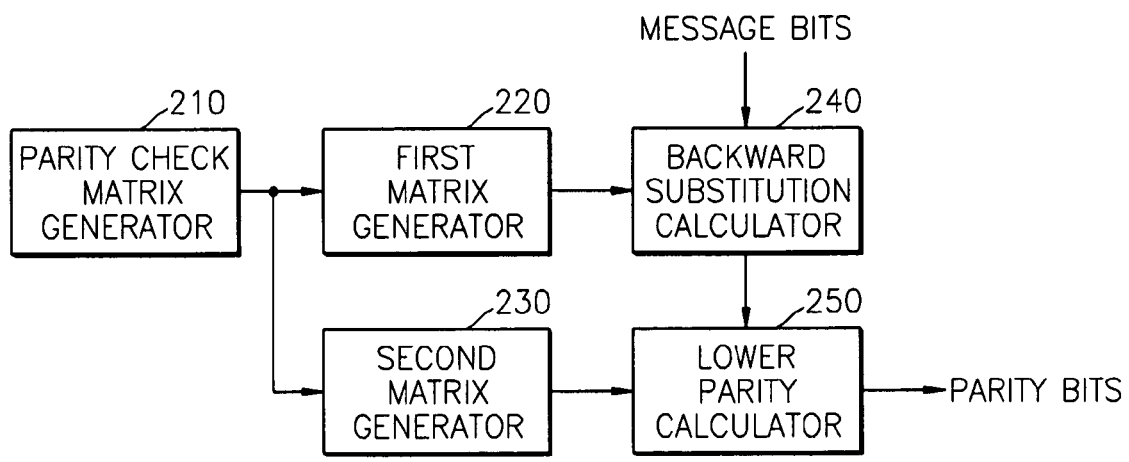
FIG. 2 is a block diagram of an apparatus for generating error correction parity information according to an aspect of the invention.

FIG. 2 is a block diagram of an apparatus for generating error correction parity information according to an aspect of the invention. The parity information generation apparatus comprises a parity check matrix generator 210, a first matrix generator 220, a second matrix generator 230, a backward substitution calculator 240, and a lower parity calculator 250. The operations of the parity information generation apparatus will be described with reference to FIGS. 2 and 3.

Figure 3:
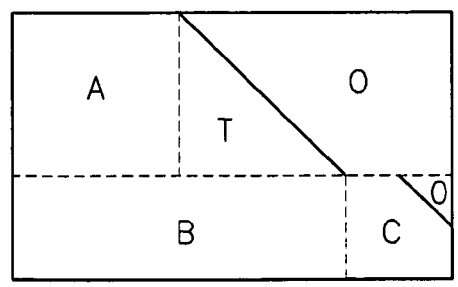
FIG. 3 shows a parity check matrix H for generating error correction parity information according to an aspect of the invention.

Referring to FIGS. 2 and 3, the parity check matrix generator 210 generates a parity check matrix (shown in FIG. 3) having m rows and n columns, wherein m is a number of parity bits and n is a number of codeword bits, wherein the number of "ones" included in the rows is the same as that included in the columns, and the remaining elements (i.e., excepting the "ones") are all "zero". The first matrix generator 220 generates a lower triangular matrix, corresponding to a T matrix shown in FIG. 3. The T matrix is generated using a column and row permutation method in which the columns and the rows are interchanged using the parity check matrix having n columns and m rows, wherein all elements within the right and upper triangular area of a portion of the parity check matrix consisting of k columns starting from a (n−m+1)-th column of the lower triangular matrix are "zero". The first matrix generator 220 creates the lower triangular matrix so that "zeros" are distributed in the right upper portion of the parity check matrix as much as possible, and so that all "ones" within the portion of the T matrix including the k columns among columns corresponding to m parity bits are located lower than diagonal elements in the portion of the parity check matrix corresponding to a lower triangular form of parities.

The second matrix generator 230 creates a second matrix, using the remaining portion of the parity check matrix except for the lower triangular matrix (the "T" matrix of FIG. 3) created by the first matrix generator 220. The second matrix is represented by the "C" matrix in FIG. 3. The "C" matrix created by the second matrix generator 230 is a scaled-down version of the conventional parity check matrix H shown in FIG. 1.

The backward substitution calculator 240 obtains k parity bits of the m parity bits by performing a backward substitution calculation using (n−m) message bits S and the lower triangular matrix generated by the first matrix generator 220. This calculation is performed using the following Equation (2) and the k parity bits of the entire m parity bits are obtained.

$$P_l = -\sum_{j=1}^{n-m} H_{l,j} S_j - \sum_{j=1}^{l-1} H_{l,j+n-m} P_j \qquad (2)$$

The lower parity calculator 250 obtains (m−k) parity bits of the m parity bits, i.e., the remaining parity bits of the m parity bits excluding the k parity bits obtained by the backward substitution calculator 240, using the second matrix generated by the second matrix generator 230. That is, because the "C" matrix corresponding to the second matrix is a scaled-down version of the conventional parity check matrix H shown in FIG. 1, the (m−k) parity bits can be obtained using a Gaussian elimination method or a method such as Equation (1) above.

Accordingly, the invention can be efficiently applied to technical fields requiring fast encoding.

As described above, according to an aspect of the invention, it is possible to reduce the amount of calculation and to efficiently generate error correction parity information by generating parity information using a parity check matrix for implementing a Low Density Parity Check (LDPC) encoder, to thereby make the amount of calculation required to be of approximately order n corresponding to the number of columns of the parity check matrix.

Although several embodiments of the invention have been shown and described, it would be appreciated by those skilled in the art that changes may be made in these embodiments without departing from the principles and spirit of the invention, the scope of which is defined in the claims and their equivalents.

What is claimed is:

1. A method of generating error correction parity information using a parity check matrix having m rows and n columns, wherein m is a number of parity bits and n is a number of codeword bits, wherein a same fixed number of elements in each of the rows has a value of 1 and all remaining elements in each of the rows has a value of 0, and wherein a same fixed number of elements in each of the columns has a value of 1 and all remaining elements in each of the columns has a value of 0, the method comprising:

generating a lower triangular matrix in 1st through k-th rows and (n−m+1)-th through (n−m+k)-th columns of the parity check matrix by performing row and column permutations on the parity check matrix, wherein k<m; and obtaining m parity bits using the parity check matrix including the lower triangular matrix and (n−m) message bits.

2. The method of claim 1, wherein the obtaining of the m parity bits comprises obtaining k parity bits of the m parity bits using a backward substitution method according to the following equation applied to 1st through k-th rows and 1st through (n−m+k)-th columns of the parity check matrix:

$$P_l = -\sum_{j=1}^{n-m} H_{l,j} S_j - \sum_{j=1}^{l-1} H_{l,j+n-m} p_j.$$

3. The method of claim 1, wherein the generating of the lower triangular matrix comprises generating a "0" matrix in the 1st through k-th rows and (m−m+k+1)-th through n-th columns of the parity check matrix, wherein all elements of the "0" matrix have a value of 0.

4. The method of claim 1, further comprising generating a second matrix in (k+1)-th through m-th rows and (n−m+k+1)-th through n-th columns of the parity check matrix, wherein all elements in an upper right corner portion of the second matrix have a value of 0; and wherein the obtaining of the m parity bits comprises obtaining (m−k) parity bits of the m parity bits using the second matrix and either a Gaussian elimination method or a method using the following equation:

$$H\begin{bmatrix} A & B & T \\ C & D & E \end{bmatrix} \to H \times \begin{bmatrix} 1 & 0 \\ -ET^{-1} & 1 \end{bmatrix} = \begin{bmatrix} A & B & T \\ -ET^{-1}A+C & -ET^{-1}B+D & 0 \end{bmatrix}$$

$$P_1 = -\Phi^{-1}[-ET^{-1}AS^T + CS^T],$$

$$\Phi = -ET^{-1}B + D,$$

$$P_2 = -T^{-1}[AS^T + BP_1^T].$$

5. A method of generating error correction parity information, the method comprising:

generating a parity check matrix having m rows and n columns, wherein m is a number of parity bits and n is a number of codeword bits, wherein a same fixed number of elements in each of the rows has a value of 1 and all remaining elements in each of the rows has a value of 0, and wherein a same fixed number of elements in each of the columns has a value of 1 and all remaining elements in each of the columns has a value of 0;

generating a lower triangular matrix in 1st through k-th rows and (n−m+1)-th through (n−m+k)-th columns of the parity check matrix, wherein k<m;

generating a second matrix in (k+1)-th through m-th rows and (n−m+k+1)-th through n-th columns of the parity check matrix, wherein all elements in an upper right corner portion of the second matrix have a value of 0;

obtaining k parity bits of m parity bits by performing a backward substitution calculation using the lower triangular matrix and (n−m) message bits; and obtaining (m−k) parity bits of the m parity bits using the second matrix.

6. The method of claim 5, wherein the generating of the lower triangular matrix comprises generating a "0" matrix in the 1st through k-th rows and (n−m+k+1)-th through n-th columns of the parity check matrix, wherein all elements of the "0" matrix have a value of 0.

7. The method of claim 5, wherein the same fixed number of elements in each of the rows having a value of 1 is equal to the same fixed number of elements in each of the columns having a value of 1.

8. The method of claim 5, wherein the backward substitution calculation performed in the obtaining of the k parity bits is performed using the following equation:

$$P_l = -\sum_{j=1}^{n-m} H_{l,j} S_j - \sum_{j=1}^{l-1} H_{l,j+n-m} p_j.$$

9. The method of claim 5, wherein the second matrix is a scaled-down version of a processed parity check matrix having m rows and n columns and having an upper right corner portion in which all elements have a value of 0 that can be obtained by processing the parity check matrix having m rows and n columns.

10. The method of claim 9, wherein the obtaining of the (m−k) parity bits comprises obtaining the (m−k) parity bits using the second matrix and either a Gaussian elimination method or a method using the following equation:

$$H\begin{bmatrix} A & B & T \\ C & D & E \end{bmatrix} \to H \times \begin{bmatrix} 1 & 0 \\ -ET^{-1} & 1 \end{bmatrix} = \begin{bmatrix} A & B & T \\ -ET^{-1}A+C & -ET^{-1}B+D & 0 \end{bmatrix}$$

$$P_1 = -\Phi^{-1}[-ET^{-1}AS^T + CS^T],$$

$$\Phi = -ET^{-1}B + D,$$

$$P_2 = -T^{-1}[AS^T + BP_1^T].$$

11. An apparatus that generates error correction parity information, the apparatus comprising:

a parity check matrix generator that generates a parity check matrix having m rows and n columns, wherein m is a number of parity bits and n is a number of codeword bits, wherein a same fixed number of elements in each of the rows has a value of 1 and all remaining elements in each of the rows has a value of 0, and wherein a same fixed number of elements in each of the columns has a value of 1 and all remaining elements in each of the columns has a value of 0;

a first matrix generator that generates a lower triangular matrix in 1st through k-th rows and (n−m+1)-th through (n−m+k)-th columns of the parity check matrix, wherein k<m;

a second matrix generator that generates a second matrix in (k+1)-th through m-th rows and (n−m+k+1)-th through n-th columns of the parity check matrix, wherein all elements in an upper right corner portion of the second matrix have a value of 0;

a backward substitution calculator that obtains k parity bits of m parity bits by performing a backward substitution calculation using the lower triangular matrix and (n−m) message bits; and a lower parity calculator that obtains (m−k) parity bits of the m parity bits using the second matrix.

12. The apparatus of claim 11, wherein the first matrix generator also generates a "0" matrix in the 1st through k-th rows and (n−m+k+1)-th through n-th columns of the parity check matrix, wherein all elements of the "0" matrix have a value of 0.

13. The apparatus of claim 11, wherein the same fixed number of elements in each of the rows having a value of 1 is equal to the same fixed number of elements in each of the columns having a value of 1.

14. The apparatus of claim 11, wherein the backward substitution calculator performs the backward substitution calculation using the following equation:

$$P_l = -\sum_{j=1}^{n-m} H_{l,j} S_j - \sum_{j=1}^{l-1} H_{l,j+n-m} p_j.$$

15. The apparatus of claim 11, wherein the second matrix is a scaled-down version of a processed parity check matrix having m rows and n columns and having an upper right corner portion in which all elements have a value of 0 that can be obtained by processing the parity check matrix having m rows and n columns.

16. The apparatus of claim 15, wherein the lower parity calculator obtains the (m−k) parity bits using the second matrix and either a Gaussian elimination method or a method using the following equation:

$$H \begin{bmatrix} A & B & T \\ C & D & E \end{bmatrix} \rightarrow H \times \begin{bmatrix} 1 & 0 \\ -ET^{-1} & 1 \end{bmatrix} = \begin{bmatrix} A & B & T \\ -ET^{-1}A+C & -ET^{-1}B+D & 0 \end{bmatrix}$$

$P_1 = -\Phi^{-1}[-ET^{-1}AS^T + CS^T]$, $\Phi = -ET^{-1}B + D$, $P_2 = -T^{-1}[AS^T + BP_1^T]$.

17. An apparatus that generates parity information, the apparatus comprising:

a parity check matrix generator that generates a parity check matrix having rows and columns, wherein a same fixed number of elements in each of the rows has a value of 1 and all remaining elements in each of the rows has a value of 0, and wherein a same fixed number of elements in each of the columns has a value of 1 and all remaining elements in each of the columns has a value of 0;

a first matrix generator that generates a lower triangular matrix in a first predetermined portion of the parity check matrix;

a backward substitution calculator that obtains a first set of parity bits based on message bits and the lower triangular matrix;

a second matrix generator that generates a second matrix in a second predetermined portion of the parity check matrix, wherein all elements in an upper right corner portion of the second matrix have a value of 0; and a lower parity calculator that obtains a second set of parity bits based on the second matrix.

18. The apparatus of claim 17, wherein the first matrix generator generates the lower triangular matrix by performing row and column permutations on the parity check matrix.

19. The apparatus of claim 17, wherein the backward substitution calculator obtains the first set of parity bits using the following equation:

$$P_l = -\sum_{j=1}^{n-m} H_{l,j} S_j - \sum_{j=1}^{l-1} H_{l,j+n-m} p_j.$$

20. The apparatus of claim 17, wherein the second matrix is a scaled-down version of a processed parity check matrix having an upper right corner portion in which all elements have a value of 0 that can be obtained by processing the parity check matrix generated by the parity check matrix generator.

21. The apparatus of claim 20, wherein the second predetermined portion of the parity check matrix is different from the first predetermined portion of the parity check matrix.

22. The apparatus of claim 21, wherein the lower parity calculator obtains the second set of parity bits using the following equation:

$$H \begin{bmatrix} A & B & T \\ C & D & E \end{bmatrix} \rightarrow H \times \begin{bmatrix} 1 & 0 \\ -ET^{-1} & 1 \end{bmatrix} = \begin{bmatrix} A & B & T \\ -ET^{-1}A+C & -ET^{-1}B+D & 0 \end{bmatrix}$$

$P_1 = -\Phi^{-1}[-ET^{-1}AS^T + CS^T]$, $\Phi = -ET^{-1}B + D$, $P_2 = -T^{-1}[AS^T + BP_1^T]$.

* * * * *

UNITED STATES PATENT AND TRADEMARK OFFICE
CERTIFICATE OF CORRECTION

PATENT NO. : 7,243,286 B2
APPLICATION NO. : 10/738203
DATED : July 10, 2007
INVENTOR(S) : Ki-hyun Kim et al.

It is certified that error appears in the above-identified patent and that said Letters Patent is hereby corrected as shown below:

Column 5, line 33
change "(m-m+k+1)-th" to --(n-m+k+1)-th--

Column 5, line 47
replace "$H\begin{bmatrix} ABT \\ CDE \end{bmatrix}$" with --$H = \begin{bmatrix} ABT \\ CDE \end{bmatrix}$--.

Column 6, line 45
replace "$H\begin{bmatrix} ABT \\ CDE \end{bmatrix}$" with --$H = \begin{bmatrix} ABT \\ CDE \end{bmatrix}$--.

Column 7, line 43
replace "$H\begin{bmatrix} ABT \\ CDE \end{bmatrix}$" with --$H = \begin{bmatrix} ABT \\ CDE \end{bmatrix}$--.

Column 8, line 47
replace "$H\begin{bmatrix} ABT \\ CDE \end{bmatrix}$" with --$H = \begin{bmatrix} ABT \\ CDE \end{bmatrix}$--.

Signed and Sealed this

Twentieth Day of November, 2007

JON W. DUDAS
*Director of the United States Patent and Trademark Office*